United States Patent
Wasekura

(10) Patent No.: US 9,503,076 B2
(45) Date of Patent: Nov. 22, 2016

(54) GATE POTENTIAL CONTROL CIRCUIT

(71) Applicant: TOYOTA JIDOSHA KABUSHIKI KAISHA, Toyota-shi, Aichi-ken (JP)

(72) Inventor: Masaki Wasekura, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/726,057

(22) Filed: May 29, 2015

(65) Prior Publication Data
US 2015/0358019 A1 Dec. 10, 2015

(30) Foreign Application Priority Data

Jun. 4, 2014 (JP) .................. 2014-116072

(51) Int. Cl.
*H03K 5/12* (2006.01)
*H03K 17/567* (2006.01)
*H03K 5/24* (2006.01)
*H03K 17/16* (2006.01)

(52) U.S. Cl.
CPC .............. *H03K 17/567* (2013.01); *H03K 5/12* (2013.01); *H03K 5/24* (2013.01); *H03K 17/163* (2013.01)

(58) Field of Classification Search
CPC ........ H03K 17/567; H03K 5/24; H03K 5/12; H03K 17/163
See application file for complete search history.

(56) References Cited

U.S. PATENT DOCUMENTS

| | | | | |
|---|---|---|---|---|
| 8,410,825 B2* | 4/2013 | Wasekura | .............. | H03K 17/14 327/108 |
| 8,704,556 B2* | 4/2014 | Hamanaka | ........... | H03K 17/567 327/109 |
| 8,766,671 B2* | 7/2014 | Senda | ................ | H03K 17/0406 327/108 |
| 2012/0025897 A1 | 2/2012 | Wasekura | | |
| 2016/0079974 A1* | 3/2016 | Wasekura | ............ | H03K 17/567 327/109 |

FOREIGN PATENT DOCUMENTS

| CN | 102439831 A | 5/2012 |
|---|---|---|
| WO | 2012/014314 A1 | 2/2012 |

* cited by examiner

*Primary Examiner* — Jung Kim
(74) *Attorney, Agent, or Firm* — Oliff PLC

(57) ABSTRACT

A gate potential control circuit includes a driving switching element, a first gate potential supply part, a first switching element, a first resistor, and a first operational amplifier. The first operational amplifier includes an output portion connected to a gate of the first switching element, an inverting input into which a first reference potential is input, and a non-inverting input into which a closer one of a first value and a second value to a potential of the first gate potential supply part is input. The first value is based on a potential difference obtained by subtracting a potential of a terminal of the first resistor on a driving switching element side from a potential of a terminal of the first resistor on a first gate potential supply part side. The second value is based on a potential of a terminal of the first switching element.

3 Claims, 13 Drawing Sheets

GATE POTENTIAL CONTROL CIRCUIT

INCORPORATION BY REFERENCE

The disclosure of Japanese Patent Application No. 2014-116072 filed on Jun. 4, 2014 including the specification, drawings and abstract is incorporated herein by reference in its entirety.

BACKGROUND OF THE INVENTION

1. Field of the Invention

The present invention relates to a circuit that controls the potential of a gate of a switching element.

2. Description of Related Art

A circuit that controls the potential of a gate of IGBT is disclosed in International Publication WO2012/014314. This circuit has a pMOS and a resistor that are connected in series between the gate of the IGBT and a driving power supply. An operational amplifier is connected to a gate of the pMOS. The pMOS is controlled by the operational amplifier so that the pMOS can have a constant drain voltage. As a result, the potential of the gate of the IGBT is increased to a predetermined value.

In the technique that is disclosed in International Publication WO2012/014314, the rate of increase of the gate potential of the IGBT is determined by the slew rate of the operational amplifier. Because the slew rate considerably varies among operational amplifiers, the rate of increase of the gate potential of the IGBT varies among the gate potential control circuits of International Publication WO2012/014314.

SUMMARY OF THE INVENTION

The present invention provides a gate potential control circuit that can suppress the influence of the slew rate of an operational amplifier while controlling the gate potential of a switching element using the operational amplifier.

A gate potential control circuit according to a first aspect of the present invention includes a driving switching element, a first gate potential supply part, a first switching element, a first resistor, and a first operational amplifier. The first switching element and the first resistor are connected in series between a gate of the driving switching element and the first gate potential supply part. The first operational amplifier includes an output portion connected to a gate of the first switching element, an inverting input into which a first reference potential is input, and a non-inverting input into which a closer one of a first value and a second value to a potential of the first gate potential supply part is input. The first value is based on a potential difference obtained by subtracting a potential of a terminal of the first resistor on a driving switching element side from a potential of a terminal of the first resistor on a first gate potential supply part side. The second value is based on a potential of a terminal of the first switching element.

According to the first aspect of the present invention, the operational amplifier can accurately control the rate of change of the gate potential of the driving switching element.

A gate potential control circuit according to a second aspect of the present invention includes a driving switching element, a first gate potential supply part, a first switching element, a first resistor, and a first operational amplifier. The first switching element is connected between a gate of the driving switching element and the first gate potential supply part. The first resistor is connected between the driving switching element and the first switching element. The first operational amplifier includes an output portion connected to a gate of the first switching element, a non-inverting input into which a potential of a terminal of the first switching element on a driving switching element side is input, and an inverting input into which a farther one of a first potential and a fourth reference potential from a potential of the first gate potential supply part is input. The first potential is obtained by adding a third reference potential to a potential of a terminal of the first resistor on a driving switching element side.

According to the second aspect of the present invention, the operational amplifier can accurately control the rate of change of the gate potential of the driving switching element.

A gate potential control circuit according to a third aspect of the present invention includes a driving switching element, a first gate potential supply part, a first switching element, a first resistor, and a first operational amplifier. The first switching element and the first resistor are connected in series between a gate of the driving switching element and the first gate potential supply part. The first operational amplifier includes an output portion connected to a gate of the first switching element, and is configured to control a potential of the gate of the first switching element such that an absolute value of a potential difference between both ends of the first resistor is a seventh reference potential or lower and a potential of a terminal of the first switching element on a driving switching element side changes to an eighth reference potential.

According to the third aspect of the present invention, the operational amplifier can accurately control the rate of change of the gate potential of the driving switching element.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
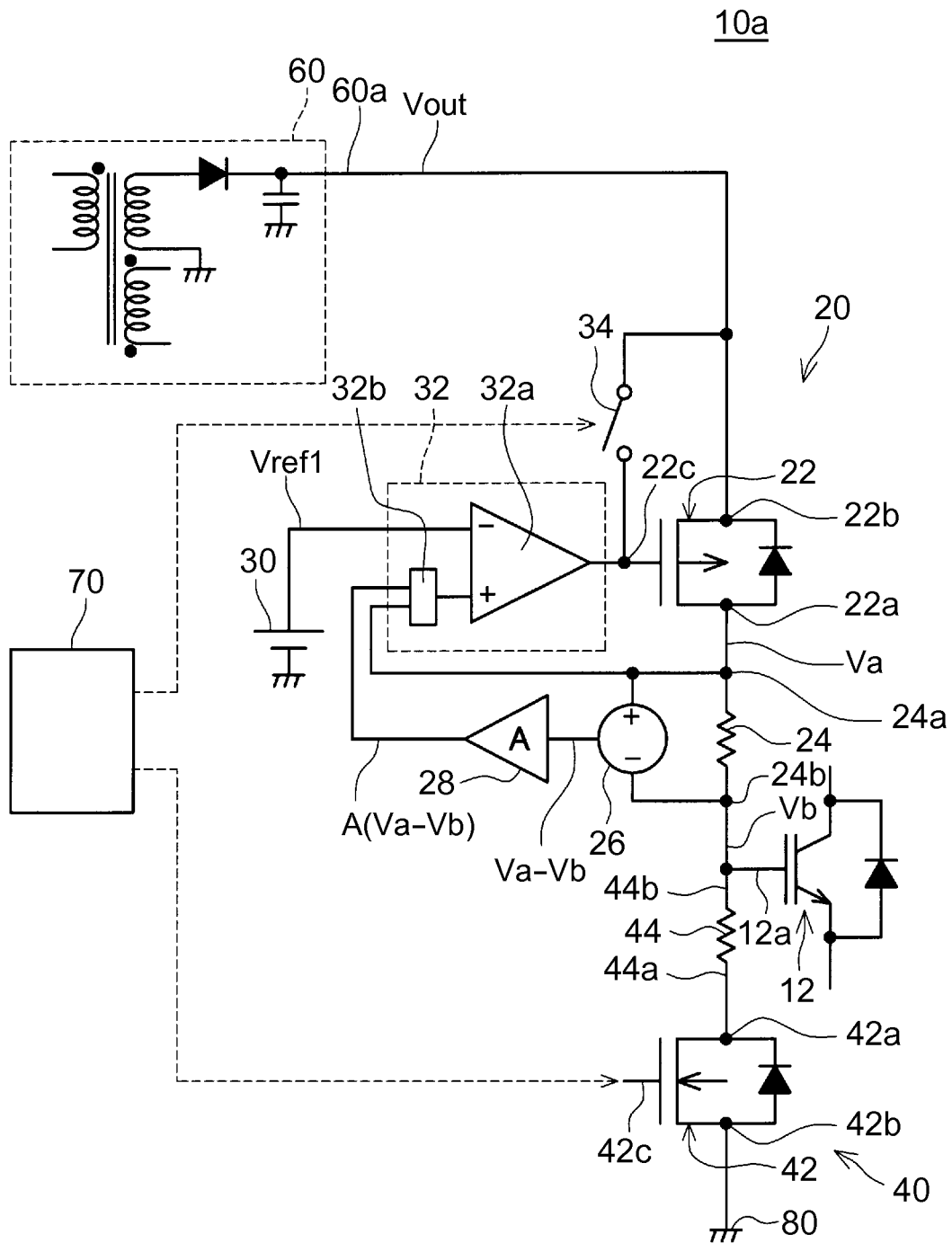
FIG. 1 is a circuit diagram of a gate potential control circuit 10a of a first embodiment of the present invention.

A gate potential control circuit 10a of a first embodiment that is shown in FIG. 1 controls the potential of a gate 12a of an IGBT 12. The IGBT 12 is a switching element for current control that is used in an inverter, DC-DC converter, or the like. It should be noted that an IGBT is used as a driving switching element in this embodiment whereas another type of switching element (such as an MOS) may be used as a driving switching element in other embodiments. The gate potential control circuit 10a has a gate charge circuit 20, a gate discharge circuit 40, an insulation power supply 60, and a controller 70.

The insulation power supply 60 outputs a potential Vout to an output terminal 60a. The potential Vout is the highest potential in the gate potential control circuit 10a.

The gate charge circuit 20 is a circuit that supplies electric charge to the gate 12a of the IGBT 12 to turn on the IGBT 12. The gate charge circuit 20 has a pMOS 22, a first resistor 24, a subtractor 26, an amplifier 28, a first reference power supply 30, a first operational amplifier IC 32, and a switch 34.

The pMOS 22 and the first resistor 24 are connected in series between the gate 12a of the IGBT 12 and the output terminal 60a of the insulation power supply 60. The pMOS 22 is connected at a location closer to the insulation power supply 60 than the first resistor 24. The pMOS 22 has a source 22b that is connected to the output terminal 60a of the insulation power supply 60. The pMOS 22 has a drain 22a that is connected to a terminal 24a of the first resistor 24. The first resistor 24 also has a terminal 24b that is connected to the gate 12a of the IGBT 12. A potential Va that is shown in FIG. 1 is the potential of the terminal 24a of the first resistor 24, which is equal to the potential of the drain 22a of the pMOS 22. A potential Vb that is shown in FIG. 1 is the potential of the terminal 24b of the first resistor 24, which is equal to the potential of the gate 12a of the IGBT 12.

The subtractor 26 has a plus terminal that is connected to the terminal 24a of the first resistor 24. The subtractor 26 has a minus terminal that is connected to the terminal 24b of the first resistor 24. The subtractor 26 has an output terminal that is connected to the amplifier 28. The subtractor 26 outputs a potential Va−Vb that is obtained by subtracting the potential Vb of the terminal 24b from the potential Va of the terminal 24a (i.e., the potential difference between both ends of the first resistor 24) to the output terminal.

The amplifier 28 has an input terminal that is connected to the output terminal of the subtractor 26. The amplifier 28 has an output terminal that is connected to the first operational amplifier IC 32. The amplifier 28 outputs a potential that is obtained by multiplying the output potential Va−Vb from the subtractor 26 by A, which is a constant that is greater than 1. The output potential A(Va−Vb) from the amplifier 28 is input into the first operational amplifier IC 32.

The first reference power supply 30 has a positive electrode that is connected to the first operational amplifier IC 32. The first reference power supply 30 has a negative electrode that is connected to the ground. The first reference power supply 30 outputs a first reference potential Vref1.

The first operational amplifier IC 32 is an IC that has a first operational amplifier 32a and a first selector 32b. Into the first selector 32b, the potential Va of the terminal 24a of the first resistor 24 and the output potential A(Va−Vb) from the amplifier 28 are input. The first selector 32b outputs a higher one of the potential Va and the potential A(Va−Vb). The first operational amplifier 32a has a non-inverting input, into which the output potential from the first selector 32b (i.e., the higher one of the potential Va and the potential A(Va−Vb)) is input. The first operational amplifier 32a has an inverting input, into which the first reference potential Vref1 is input. The first operational amplifier 32a has an output portion that is connected to a gate 22c of the pMOS 22. The first operational amplifier 32a outputs a plus potential when the non-inverting input has a higher potential than the inverting input, and outputs a minus potential when the inverting input has a higher potential than the non-inverting input. In this way, the first operational amplifier 32a controls the potential of the gate 22c of the pMOS 22 so that the potential that is input into the non-inverting input and the potential that is input into the inverting input can be equal to each other.

The switch 34 is connected between the source 22b and the gate 22c of the pMOS 22. The switch 34 switches a conducting state and a cutoff state between the source 22b and the gate 22c. The switch 34 is controlled by a signal from the controller 70.

The gate discharge circuit 40 has a second resistor 44 and an nMOS 42. The second resistor 44 and the nMOS 42 are connected in series between the gate 12a of the IGBT 12 and a ground 80. The nMOS 42 is connected at a location closer to the ground 80 than the second resistor 44. The nMOS 42 has a source 42b that is connected to the ground 80. The nMOS 42 has a drain 42a that is connected to a terminal 44a of the second resistor 44. The nMOS 42 has a gate 42c that is connected to the controller 70. The nMOS 42 performs switching in response to a signal from the controller 70. The second resistor 44 has a terminal 44b that is connected to the gate 12a of the IGBT 12.

The controller 70 controls the switch 34 and the nMOS 42.

Figure 2:
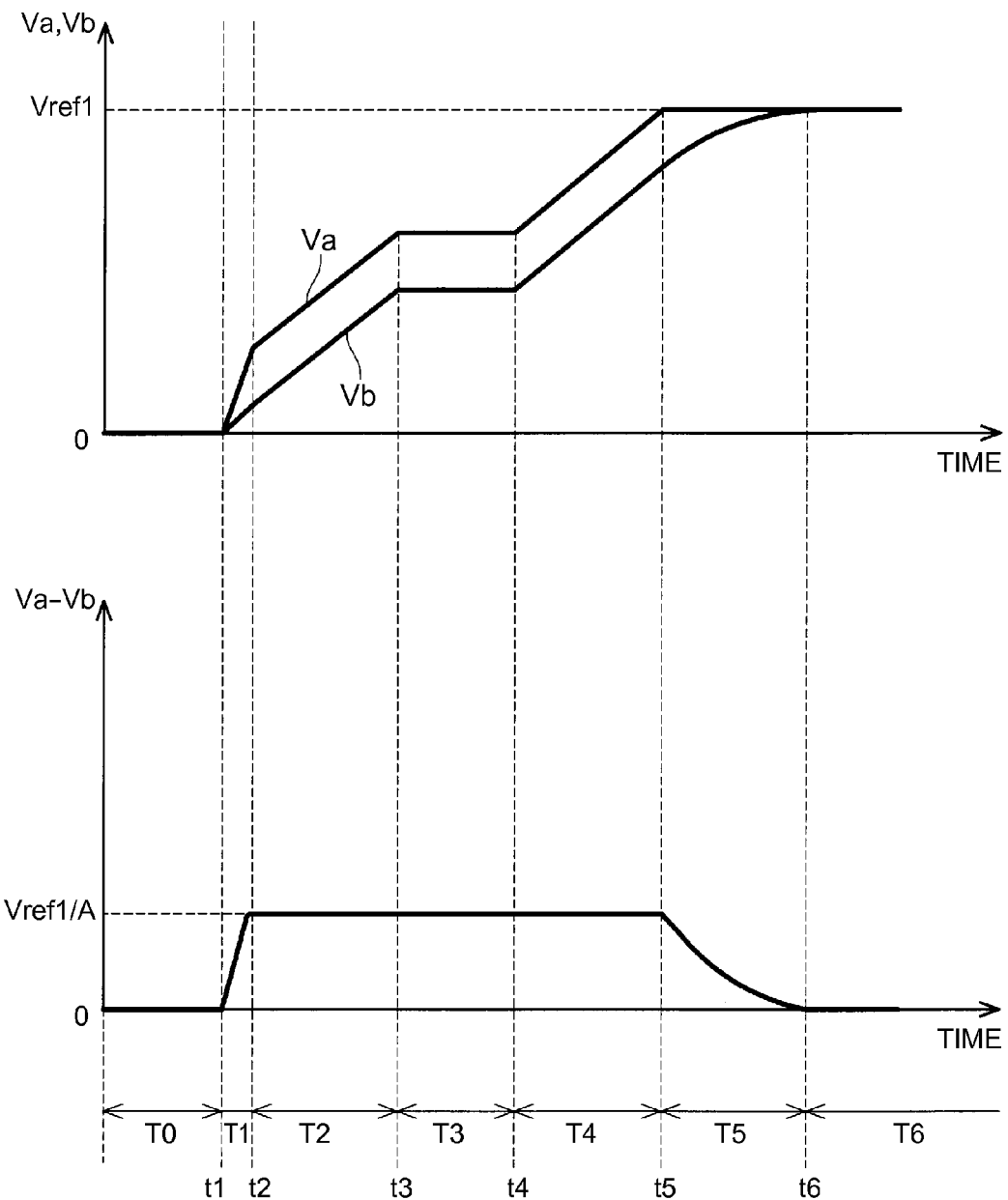
FIG. 2 is a graph that shows how voltages change when an IGBT is turned on in the first embodiment of the present invention.

The operation of the gate potential control circuit 10a is next described. FIG. 2 shows how the potentials Va and Vb and the potential difference Va−Vb change when the IGBT 12 is switched from an off state (the state during period T0 in FIG. 2) to an on state (the state during period T6 in FIG. 2). When the IGBT 12 is in an off state (i.e., during period T0), the nMOS 42 is on and the switch 34 is on (i.e., the pMOS 22 is off). Thus, a ground potential (0 V) is being applied to the gate 12a of the IGBT 12. Thus, the potentials Va and Vb are both 0 V.

The controller 70 turns off the nMOS 42 and turns off the switch 34 at time t1 in FIG. 2. When the switch 34 is turned off, the potential of the gate 22c of the pMOS 22 becomes controllable by the first operational amplifier 32a. At time t1, because the potential Va and the potential A(Va−Vb) are both generally 0 V (ground potential), the first selector 32b outputs a generally 0 V. Thus, a generally 0 V is input into the non-inverting input of the first operational amplifier 32a. Because the inverting input has a higher potential (Vref1) than the non-inverting input (0 V), the first operational amplifier 32a decreases the potential of the output portion (i.e., the gate 22c of the pMOS 22). As a result, the pMOS 22 is turned on, and a gate current flows from the insulation power supply 60 via the pMOS 22 and the first resistor 24 toward the gate 12a of the IGBT 12. When the pMOS 22 is turned on at time t1, the gate current increases and the potential difference Va−Vb increases accordingly during the subsequent period T1. In addition, because electric charge is accumulated in the gate 12a as the gate current flows, the potential of the gate 12a gradually increases. Thus, during period T1, the potentials Va and Vb increase. In addition, during period T1, because the potential that is input into the non-inverting input is low, the first operational amplifier 32a decreases the output potential (i.e., the potential of the gate 22c) according to its slew rate. Thus, during period T1, the potentials Va and Vb increase at a gradient that is determined by the slew rate of the first operational amplifier 32a. During period T1, the potential A(Va−Vb) increases faster than the potential Va. Thus, during period T1, the potential A(Va−Vb) continues to be input into the non-inverting input of the first operational amplifier 32a.

When the gate current increases during period T1, the potential difference Va−Vb reaches a value Vref1/A at time t2. In other words, A(Va−Vb)=Vref1 is fulfilled at time t2. Then, the first operational amplifier 32a controls the potential of the gate 22c so that A(Va−Vb)=Vref1 can be maintained. Thus, during period T2 after time t2, the potential difference Va−Vb is generally constant at Vref1/A. In other words, the gate current is generally constant. Thus, during period T2 after time t2, the potentials Va and Vb increase at a gradient that is determined by the constant gate current. The potentials Va and Vb maintain a generally constant value during period T3 after time t3. This is because electric charge is charged into the Miller capacity of the IGBT 12. During period T3, the gate current (i.e., the potential difference Va−Vb) is still generally constant. After that, the charge of electric charge into the Miller capacity is completed at time t4. Thus, during period T4 after time t4, the potentials Va and Vb increase again. Because the gate current is still generally constant during period T4, the potentials Va and Vb increase during period T4 at generally the same gradient as that during period T2. When the potential Va reaches the first reference potential Vref1 at time t5, the potential Va has become higher than the potential A(Va−Vb). Thus, the first selector 32b inputs the potential Va into the non-inverting input of the first operational amplifier 32a. Then, the first operational amplifier 32a controls the potential of the gate 22c so that the potential Va can be maintained at the first reference potential Vref1. As a result, the gate current decreases, and the potential difference Va−Vb decreases accordingly. Because the potential difference Va−Vb decreases in this way, the potential Va continues to be input into the non-inverting input of the first operational amplifier 32a during period T5 after time t5. Thus, during period T5, the pMOS 22 is controlled so that the potential Va can be equal to the first reference potential Vref1. Thus, the gate current gradually decreases during period T5, and the gate current (i.e., the potential difference Va−Vb) becomes generally zero at time t6 when the potential Vb increases to a potential equal to the first reference potential Vref1. After that, the first operational amplifier 32a maintains a state where the potentials Va and Vb are equal to the first reference potential Vref1. Because the potential Vb is the potential of the gate 12a of the IGBT 12, the IGBT 12 is turned on when the potential Vb is controlled to the first reference potential Vref1.

To turn off the IGBT 12, the controller 70 turns on the switch 34 and the nMOS 42. When the switch 34 is turned on, the pMOS 22 is turned off and the supply of electric charge to the gate 12a is stopped. In addition, when the nMOS 42 is turned on, electric charge is discharged from the gate 12a to the ground 80, and the potential of the gate 12a decreases to the ground potential. As a result, the IGBT 12 is turned off.

As described above, in this gate potential control circuit 10a, the pMOS 22 is controlled so that the potential difference Va−Vb between both ends of the first resistor 24 cannot exceed a predetermined potential Vref1/A when the IGBT 12 is turned on. Thus, during periods T2 to T4, the potential difference Va−Vb (i.e., the gate current) is constant and the gradient at which the potentials Va and Vb increase is controlled to a gradient that is determined by the gate current. In other words, during periods T2 and T4, the gradient at which the potentials Va and Vb increase is controlled to a generally constant gradient that is smaller than a gradient that is determined by the slew rate. Thus, when the IGBT 12 is turned on using this gate potential control circuit 10a, the IGBT 12 can be turned on at a generally constant speed with little influence of the slew rate of the first operational amplifier 32a. Thus, when this gate potential control circuits 10a are produced on a large scale, the variation in switching speed among the gate potential control circuits 10a can be reduced with little influence of the variation in slew rate among the first operational amplifiers 32a. In addition, the potential Vb of the gate 12a of the IGBT 12 can be accurately controlled to the potential Vref1 during period T6 by the first operational amplifier 32a. In other words, with this gate potential control circuit 10a, the turn-on speed of the IGBT 12 is unlikely to vary considerably and the potential of the gate 12a of the IGBT 12 is unlikely to vary considerably.

Figure 3:
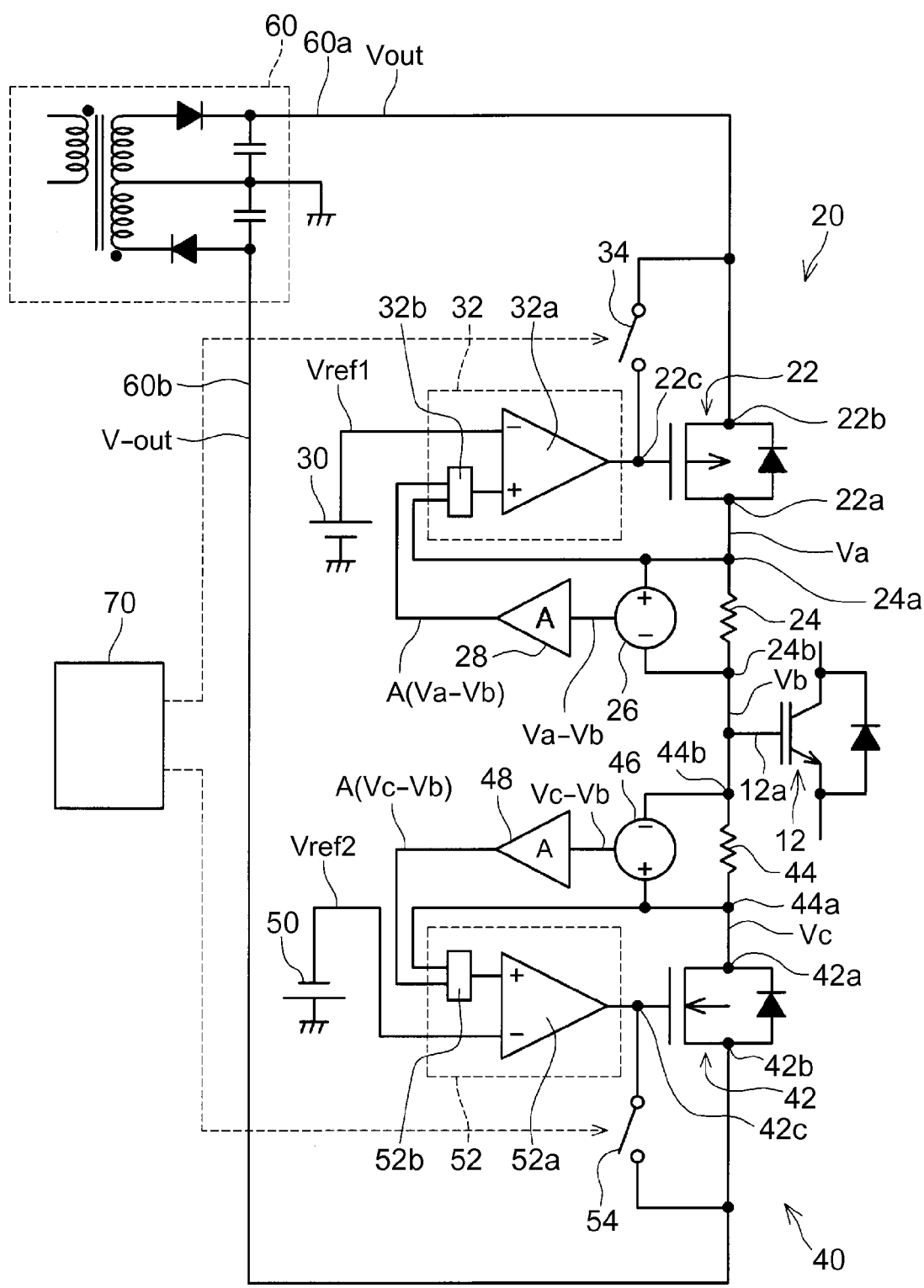
FIG. 3 is a circuit diagram of a gate potential control circuit 10b of a second embodiment of the present invention.

A gate potential control circuit 10b of a second embodiment that is shown in FIG. 3 is different from the gate potential control circuit 10a of the first embodiment in configuration of the insulation power supply 60 and the gate discharge circuit 40.

The insulation power supply 60 of the second embodiment has an output terminal 60b. To the output terminal 60b, a minus potential V-out (a potential that is lower than that of the ground) is output. The potential V-out is the lowest potential in the gate potential control circuit 10b.

The gate discharge circuit 40 of the second embodiment is a circuit that discharges electric charge from the gate 12a of the IGBT 12 to turn off the IGBT 12. The gate discharge circuit 40 has an nMOS 42, a second resistor 44, a subtractor 46, an amplifier 48, a second reference power supply 50, a second operational amplifier IC 52, and a switch 54.

The nMOS 42 and the second resistor 44 are connected in series between the gate 12a of the IGBT 12 and the minus side output terminal 60b of the insulation power supply 60. The nMOS 42 is connected at a location closer to the output terminal 60b of the insulation power supply 60 than the second resistor 44. The nMOS 42 has a source 42b that is connected to the output terminal 60b of the insulation power supply 60.

The nMOS 42 has a drain 42a that is connected to a terminal 44a of the second resistor 44. The second resistor 44 has a terminal 44b that is connected to the gate 12a of the IGBT 12. A potential Vc that is shown in FIG. 3 is the potential of the terminal 44a of the second resistor 44, which is equal to the potential of the drain 42a of the nMOS 42. The potential Vb is equal to the potential of the terminal 44b of the second resistor 44.

The subtractor 46 has a plus terminal that is connected to the terminal 44a of the second resistor 44. The subtractor 46 has a minus terminal that is connected to the terminal 44b of the second resistor 44. The subtractor 46 has an output terminal that is connected to the amplifier 48. The subtractor 46 outputs a potential (Vc−Vb) that is obtained by subtracting the potential (Vb) of the terminal 44b from the potential (Vc) of the terminal 44a to the output terminal. Because Vc<Vb, the potential Vc−Vb is a minus potential.

The amplifier 48 has an input terminal that is connected to the output terminal of the subtractor 46. The amplifier 48 has an output terminal that is connected to the second operational amplifier IC 52. The amplifier 48 outputs a potential that is obtained by multiplying the output potential (Vc−Vb) from the subtractor 46 by A. The output potential A(Vc−Vb) from the amplifier 48 is input into the second operational amplifier IC 52.

The second reference power supply 50 has a positive electrode that is connected to the ground. The second reference power supply 50 has a negative electrode that is connected to the second operational amplifier IC 52. The second reference power supply 50 outputs a second reference potential Vref2. The second reference potential Vref2 is a minus potential that is lower than that of the ground.

The second operational amplifier IC 52 is an IC that has a second operational amplifier 52a and a second selector 52b. Into the second selector 52b, the potential Vc of the terminal 44a and the output potential A(Vc−Vb) from the amplifier 48 are input. The second selector 52b outputs a lower one of the potential Vc and the potential A(Vc−Vb).

The second operational amplifier 52a has a non-inverting input, into which the output potential from the second selector 52b (i.e., the lower one of the potential Vc and the potential A(Vc−Vb)) is input. The second operational amplifier 52a has an inverting input, into which the second reference potential Vref2 is input. The second operational amplifier 52a has an output portion that is connected to the gate 42c of the nMOS 42. The second operational amplifier 52a outputs a plus potential when the non-inverting input has a higher potential than the inverting input, and outputs a minus potential when the inverting input has a higher potential than the non-inverting input. In this way, the second operational amplifier 52a controls the potential of the gate 42c of the nMOS 42 so that the potential that is input into the non-inverting input and the potential that is input into the inverting input can be equal to each other.

The switch 54 is connected between the source 42b and the gate 42c of the nMOS 42. The switch 54 switches the state between the source 42b and the gate 42c between a conducting state and a cutoff state. The switch 54 is controlled by a signal from the controller 70.

Figure 4:
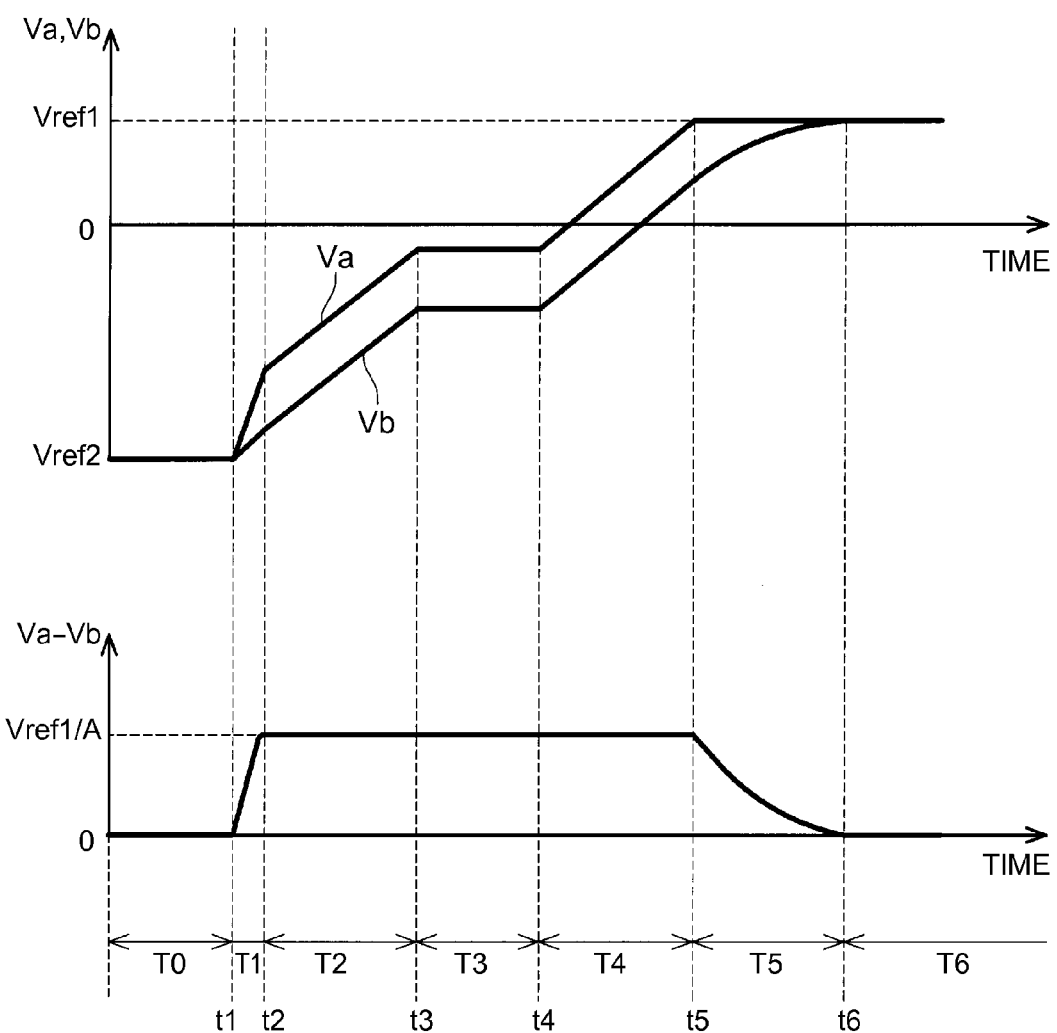
FIG. 4 is a graph that shows how voltages change when an IGBT is turned on in the second embodiment of the present invention.

The operation of the gate potential control circuit 10b is next described. FIG. 4 shows how the potentials Va and Vb and the potential difference Va−Vb change when the IGBT 12 is switched from an off state (the state during period T0 in FIG. 4) to an on state (the state during period T6 in FIG. 4). As shown in FIG. 4, during period T0 when the IGBT 12 is off, the potentials Va and Vb are equal to the second reference potential Vref2 (minus potential). In other words, the second reference potential Vref2 is being applied to the gate 12a of the IGBT 12. To turn on the IGBT 12, the controller 70 turns on the switch 54 and turns off the switch 34. When the switch 54 is turned on, the nMOS 42 is turned off. When the switch 34 is turned off, the gate charge circuit 20 increases the potentials Va and Vb to the first reference potential Vref1. This operation is the same as the operation in the first embodiment except that the potential Vref2 that is output when the IGBT 12 is off is a minus potential.

Figure 5:
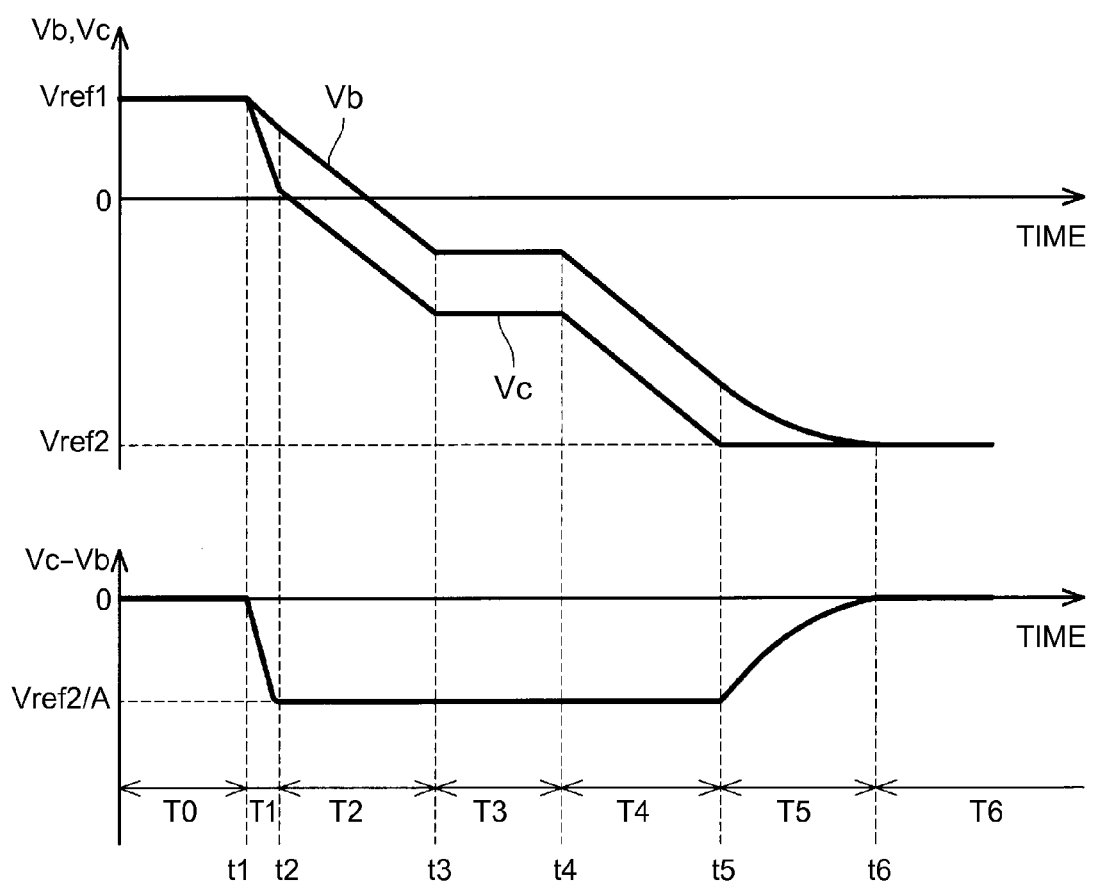
FIG. 5 is a graph that shows how voltages change when an IGBT is turned off in the second embodiment of the present invention.

The operation that is performed in the gate potential control circuit 10b when the IGBT 12 is turned off is next described. FIG. 5 shows how the potentials Vb and Vc and the potential difference Vc−Vb change when the IGBT 12 is switched from an on state (the state during period T0 in FIG. 5) to an off state (the state during period T6 in FIG. 5). As described above, during the period when the IGBT 12 is on (period T0 in FIG. 5), the switch 54 is on and the switch 34 is off. The controller 70 turns off the switch 54 and turns on the switch 34 at time t1 in FIG. 5. When the switch 34 is turned on, the pMOS 22 is turned off. When the switch 54 is turned off, the potential of the gate 42c of the nMOS 42 becomes controllable by the second operational amplifier 52a. At time t1, the potential Vb and the potential Vc are both equal to the first reference potential Vref1. Thus, output potential A(Vc−Vb) from the amplifier 48 is generally 0 V. Thus, because the potential A(Vc−Vb) is lower than the potential Vc (=Vref1), the second selector 52b inputs the potential A(Vc−Vb) into the non-inverting input of the second operational amplifier 52a. Because the non-inverting input has a higher potential (0 V) than the inverting input (Vref2: minus potential), the second operational amplifier 52a increases the potential of the output portion (i.e., the gate 42c of the nMOS 42). As a result, the nMOS 42 is turned on, and a gate current flows from the gate 12a of the IGBT 12 via the second resistor 44 and the nMOS 42 toward the output terminal 60b of the insulation power supply 60. When the nMOS 42 is turned on at time t1, the gate current increases and potential difference Vc−Vb decreases (the absolute value of the potential difference Vc−Vb increases) accordingly during the subsequent period T1. In addition, because electric charge is discharged from the gate 12a as the gate current flows, the potential of the gate 12a gradually decreases. Thus, during period T1, the potentials Vb and Vc decrease. In addition, during period T1, because the potential that is input into the non-inverting input is low, the first operational amplifier 32a decreases the output potential (i.e., the potential of the gate 42c) in accordance with its slew rate. Thus, during period T1, the potentials Vb and Vc decrease at a gradient that is determined by the slew rate of the second operational amplifier 52a. During period T1, the potential A (Vc−Vb) decreases faster than the potential Vc. Thus, the potential A(Vc−Vb) continues to be input into the non-inverting input of the second operational amplifier 52a.

When the gate current increases during period T1, the potential difference Vc−Vb reaches a value Vref2/A at time t2. In other words, A(Vc−Vb)=Vref2 is fulfilled at time t2. Then, the second operational amplifier 52a controls the potential of the gate 42c so that A(Vc−Vb)=Vref2 can be maintained Thus, during period T2 after time t2, the potential difference Vc−Vb is generally constant at Vref2/A. In other words, the gate current is generally constant. Thus, during period T2 after time t2, the potentials Vb and Vc decrease at a gradient that is determined by the constant gate current. The potentials Vb and Vc maintain a generally constant value during period T3 after time t3. This is because electric charge is discharged from the Miller capacity of the IGBT 12. During period T3, the gate current (i.e., the potential difference Vc−Vb) is still generally constant. After that, the discharge of electric charge from the Miller capacity is completed at time t4. Thus, during period T4 after time t4, the potentials Vb and Vc decrease again. Because the gate current is still generally constant during period T4, the potentials Vb and Vc decrease during period T4 at generally the same gradient as that during period T2. When the potential Vc reaches the second reference potential Vref2 at time t5, the potential Vc has become lower than the potential A(Vc−Vb). Thus, the potential Vc is input into the non-inverting input of the second operational amplifier 52a.

Then, the second operational amplifier 52a controls the potential of the gate 42c so that the potential Vc can be maintained at the second reference potential Vref2. As a result, the gate current decreases, and the potential difference Vc−Vb increases (approaches 0 V) accordingly. Because the potential difference Vc−Vb increases in this way, the potential Vc continues to be input into the non-inverting input of the second operational amplifier 52a during period T5 after time t5. Thus, during period T5, the nMOS 42 is controlled so that the potential Vc can be equal to the second reference potential Vref2. Thus, the gate current gradually decreases during period T5, and the gate current (i.e., the potential difference Vc−Vb) becomes generally zero at time t6 when the potential Vb decreases to a potential equal to the second reference potential Vref2. After that, the second operational amplifier 52a maintains a state where the potentials Vc and Vb are equal to the second reference potential Vref2. Because the potential Vb (i.e., the potential of the gate 12a of the IGBT 12) is controlled to the second reference potential Vref2 (a low potential), the IGBT 12 is turned off.

As described above, in this gate potential control circuit 10b, the nMOS 42 is controlled so that the potential difference Vc−Vb between both ends of the second resistor 44 cannot fall below a predetermined potential Vref2/A (i.e., the absolute value of the potential difference Vc−Vb cannot exceed the absolute value of the potential Vref2/A) when the IGBT 12 is turned off. Thus, during periods T2 to T4, the potential difference Vc−Vb (i.e., the gate current) is constant and the gradient at which the potentials Vb and Vc decrease is controlled to a gradient that is determined by the gate current. In other words, during periods T2 and T4, the gradient at which the potentials Vb and Vc decrease is controlled to a generally constant gradient that is smaller than a gradient that is determined by the slew rate. Thus, when the IGBT 12 is turned off using the gate potential control circuit 10b, the IGBT 12 can be turned off at a generally constant speed with little influence of the slew rate of the second operational amplifier 52a. In other words, with the gate potential control circuit 10b of the second embodiment, the IGBT 12 can be turned on or off with little influence of the slew rate of the operational amplifier. As a result, the variation in switching speed among the IGBTs 12 can be reduced during mass production. In addition, the potentials Va, Vb and Vc can be accurately controlled in the gate potential control circuit 10b.

The IGBT 12 of the first and second embodiments may be regarded as one example of the driving switching element of the present invention. The output terminal 60a of the insulation power supply 60 of the first and second embodiments may be regarded as one example of the first gate potential supply part of the present invention. The first resistor 24 of the first and second embodiments may be regarded as one example of the first resistor of the present invention. The pMOS 22 of the first and second embodiments may be regarded as one example of the first switching element of the present invention. The first operational amplifier 32a of the first and second embodiments may be regarded as one example of the first operational amplifier of the present invention. It should be noted that a greater one of the potential Va and the value A(Va−Vb) based on the potential difference Va−Vb (i.e., a value closer to the output potential Vout from the insulation power supply 60), is input into the non-inverting input of the first operational amplifier 32a of the first and second embodiments. The potential Vref1/A of the first and second embodiments may be regarded as one example of the seventh reference potential of the present invention. The first reference potential Vref1 of the first and second embodiments may be regarded as one example of the first reference potential of the present invention and also as one example of the eighth reference potential of the present invention. The output terminal 60b of the insulation power supply 60 of the second embodiment may be regarded as one example of the second gate potential supply part of the present invention. The nMOS 42 of the second embodiment may be regarded as one example of the second switching element of the present invention. The second resistor 44 of the second embodiment may be regarded as one example of the second resistor of the present invention. The second operational amplifier 52a of the second embodiment may be regarded as one example of the second operational amplifier of the present invention. The potential Vref2/A of the second embodiment may be regarded as one example of the ninth reference potential of the present invention. The second reference potential Vref2 of the second embodiment may be regarded as one example of the second reference potential of the present invention and also as one example of the tenth reference potential of the present invention. The constituent elements of the second embodiment and the constituent elements of the present invention can also be recognized as follows. The IGBT 12 of the second embodiment may be regarded as one example of the driving switching element of the present invention. The output terminal 60b of the insulation power supply 60 of the second embodiment may be regarded as one example of the first gate potential supply part of the present invention. The second resistor 44 of the second embodiment may be regarded as one example of the first resistor of the present invention. The nMOS 42 of the second embodiment may be regarded as one example of the first switching element of the present invention. The second operational amplifier 52a of the second embodiment may be regarded as one example of the first operational amplifier of the present invention. It should be noted that a smaller one of the value A(Vc−Vb) based on the potential difference Vc−Vb and the potential Vc (i.e., a value closer to the output potential V-out from the insulation power supply 60), is input into the non-inverting input of the second operational amplifier 52a of the second embodiment. As described above, the first gate potential supply part of the present invention may be a gate-on potential (for example, the output potential Vout from the insulation power supply 60 of the first and second embodiments) that is used to turn on a driving switching element (i.e., to increase the gate potential of the IGBT), or may be a gate-off potential (for example, the output potential V-out from the insulation power supply 60 of the second embodiment) that is used to turn off a driving switching element (i.e., to decrease the gate potential of the IGBT). In this case, the potential Vref2/A of the second embodiment may be regarded as one example of the seventh reference potential of the present invention. The second reference potential Vref2 of the second embodiment may be regarded as one example of the eighth reference potential of the present invention and also as one example of the first reference potential of the present invention.

Figure 6:
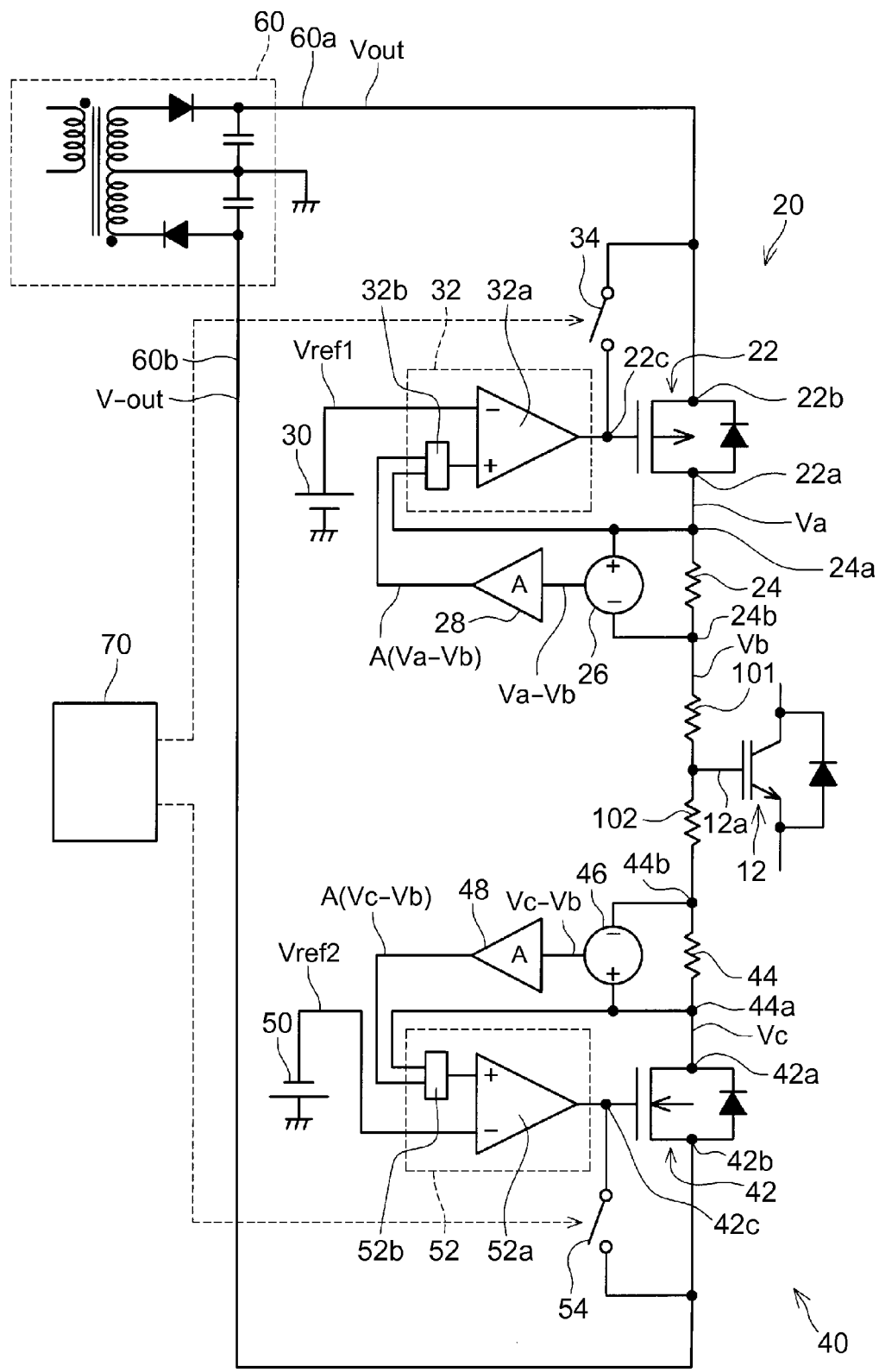
FIG. 6 is a circuit diagram that illustrates a modification of an embodiment of the present invention.
Figure 7:
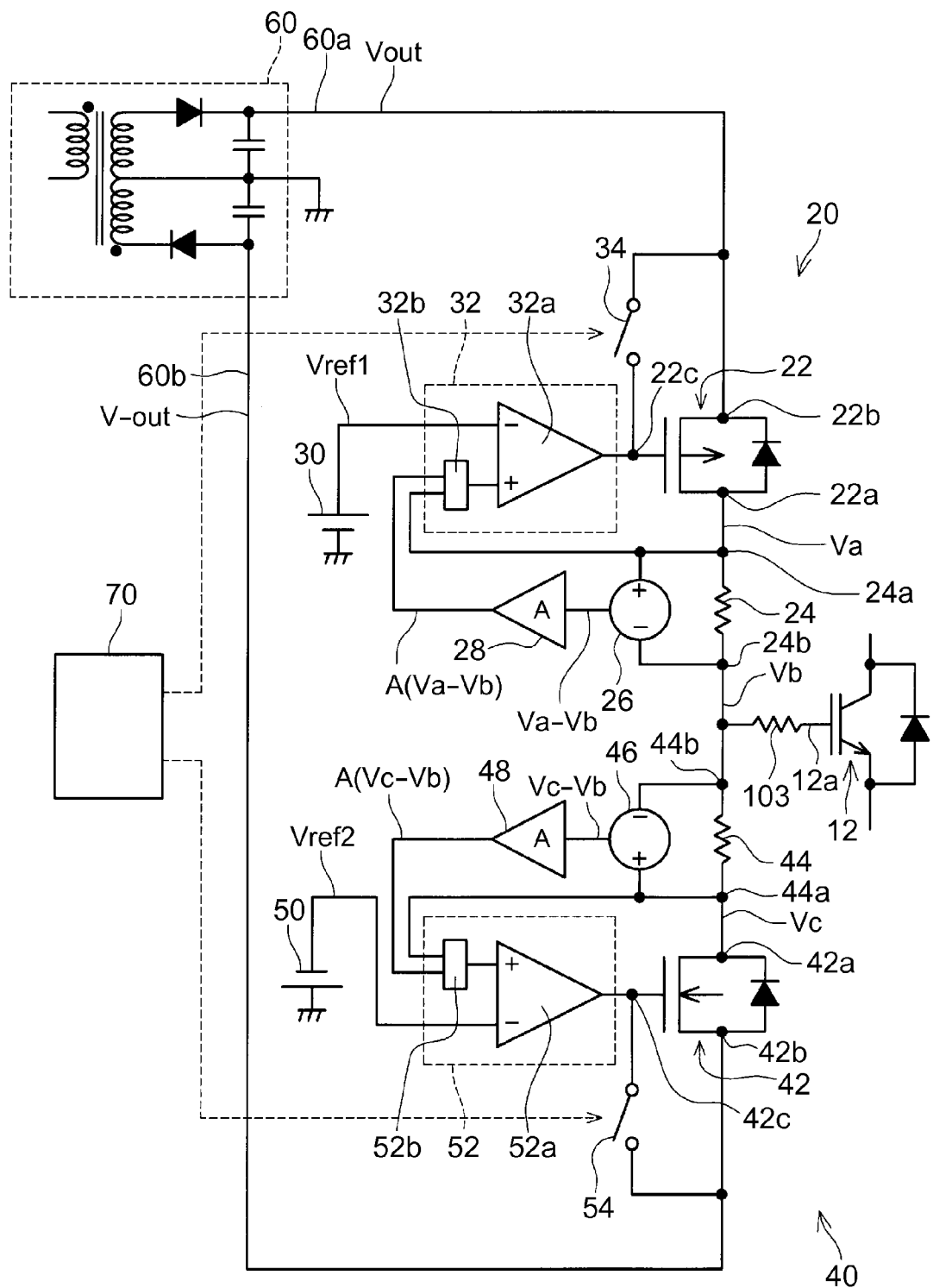
FIG. 7 is a circuit diagram that illustrates a modification of an embodiment of the present invention.

In addition, third resistors 101 and 102 may be added to the configuration of the second embodiment as shown in FIG. 6. The third resistor 101 is connected between the first resistor 24 and the gate 12a of the IGBT 12. The third resistor 102 is connected between the gate 12a of the IGBT 12 and the second resistor 44. According to this configuration, there is no possibility that the potential difference between both ends of the third resistor 101 or 102 is input into the operational amplifier. Thus, even when the resistance values of the third resistors 101 and 102 are changed, the operation of the operational amplifier is hardly affected. Thus, gate resistance can be adjusted with little influence on the operation of the operational amplifier by replacing the third resistors 101 and 102. This improves the design flexibility. Alternatively, an additional third resistor 103 may be added to a current pathway that is commonly used both in charging and discharging the gate 12a of the IGBT 12 as shown in FIG. 7. Even with the configuration that is shown in FIG. 7, the gate resistance can be adjusted with little influence on the operation of the operational amplifier. In addition, a third resistor may be added between the terminal 24b and the gate 12a of the gate potential control circuit 10a of the first embodiment that is shown in FIG. 1 in the same manner as the third resistor 101 that is shown in FIG. 6 or the third resistor 103 that is shown in FIG. 7.

Figure 8:
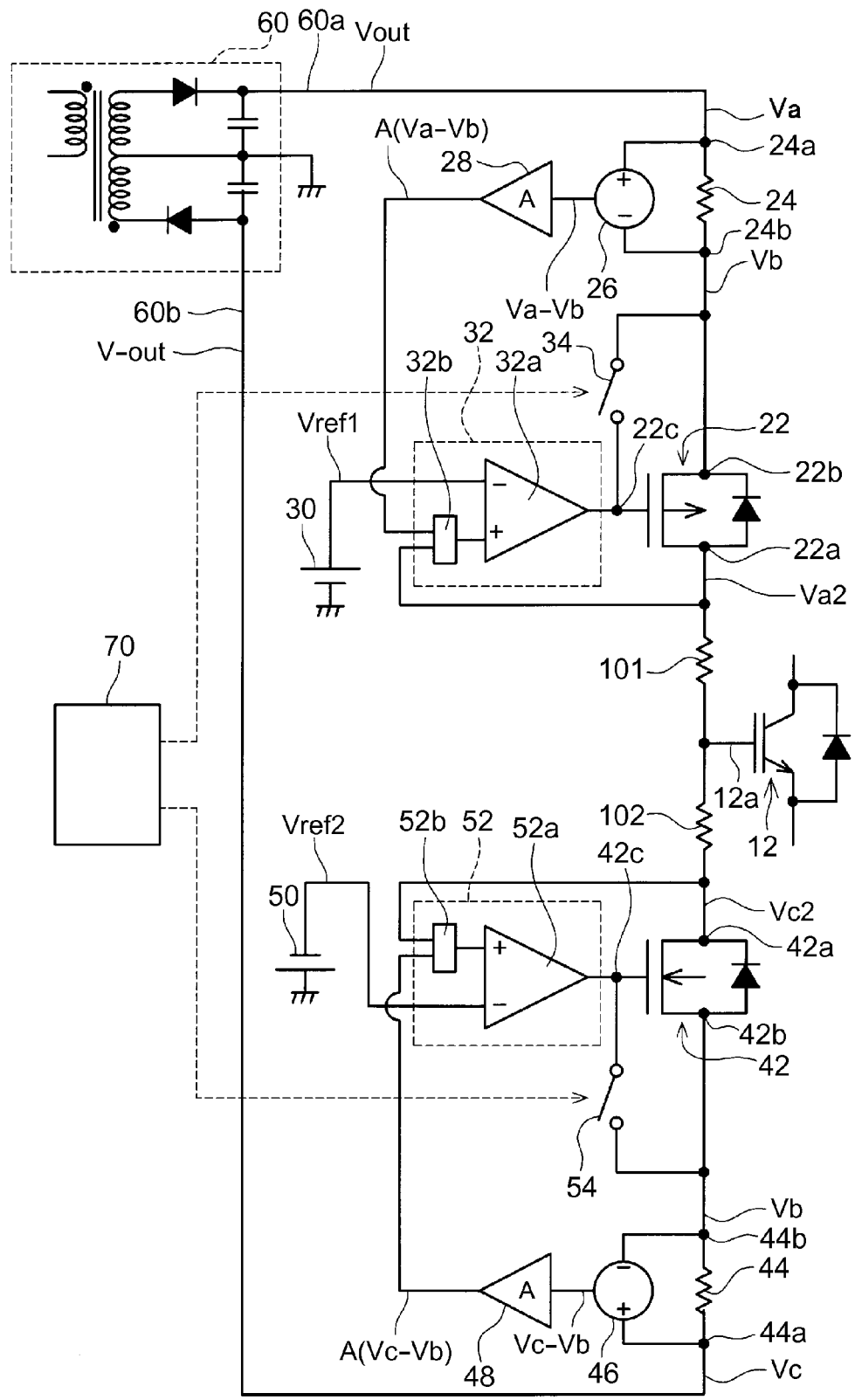
FIG. 8 is a circuit diagram that illustrates a modification of an embodiment of the present invention.

In the circuits of the first and second embodiments and the circuits that are shown in FIGS. 6 and 7, the positions of the first resistor 24 and the pMOS 22 may be swapped. In addition, in the circuit of the second embodiment and the circuits that are shown in FIGS. 6 and 7, the positions of the second resistor 44 and the nMOS 42 may be swapped. For example, the circuit that is shown in FIG. 6 may be changed as shown in FIG. 8. In this circuit, a value A(Va−Vb) that is obtained by multiplying the potential difference between both ends of the first resistor 24 and a potential Va2 of the drain 22a of the pMOS 22 are input into the first selector 32b as in the case of the circuits of the first and second embodiments and the circuits that are shown in FIGS. 6 and 7. In addition, in this circuit, the potential difference (Vc−Vb) between both ends of the second resistor 44 and a potential Vc2 of the drain 42a of the nMOS 42 are input into the second selector 52b as in the case of the circuit of the second embodiment and the circuits that are shown in FIGS. 6 and 7. Even when the arrangement is changed as shown in FIG. 8, the same operation as that in the circuits of the first and second embodiments and the circuits that are shown in FIGS. 6 and 7 is possible.

Figure 9:
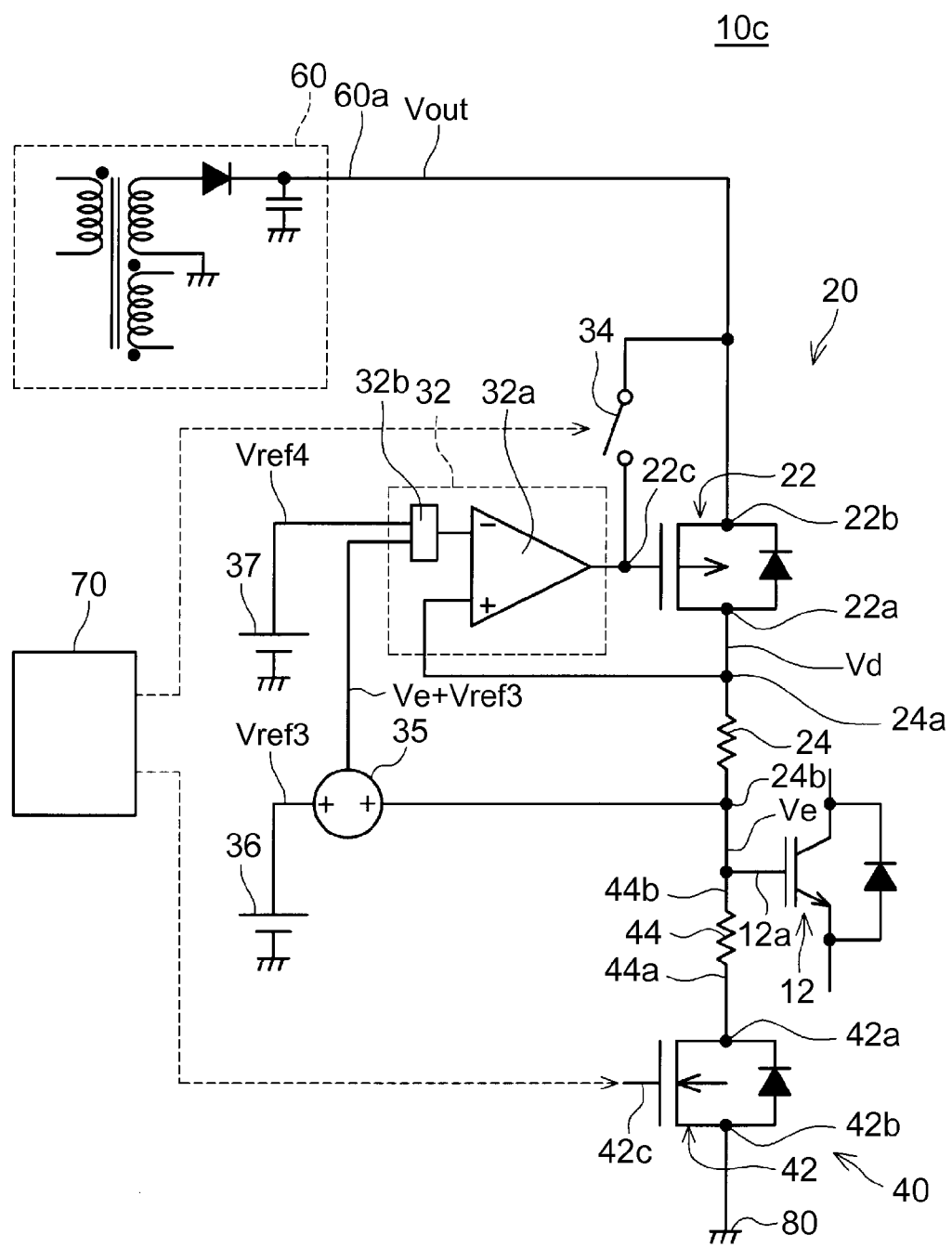
FIG. 9 is a circuit diagram of a gate potential control circuit 10c of a third embodiment of the present invention.

A gate potential control circuit 10c of a third embodiment that is shown in FIG. 9 controls the potential of the gate 12a of the IGBT 12. The gate potential control circuit 10c of the third embodiment is the same in configuration as the circuit of the first embodiment except for the configuration of the gate charge circuit 20.

In the third embodiment, the gate charge circuit 20 has a pMOS 22, a first resistor 24, an adder 35, a third reference power supply 36, a fourth reference power supply 37, a first operational amplifier IC 32, and a switch 34.

The pMOS 22 and the first resistor 24 are connected in series between the gate 12a of the IGBT 12 and the output terminal 60a of the insulation power supply 60 as in the case of the first embodiment. A potential Vd that is shown in FIG. 9 is the potential of the terminal 24a of the first resistor 24, which is equal to the potential of the drain 22a of the pMOS 22. A potential Ve that is shown in FIG. 9 is the potential of the terminal 24b of the first resistor 24, which is equal to the potential of the gate 12a of the IGBT 12.

The third reference power supply 36 has a positive electrode that is connected to the adder 35. The third reference power supply 36 has a negative electrode that is connected to the ground. The third reference power supply 36 outputs a third reference potential Vref3.

One of input terminals of the adder 35 is connected to the terminal 24b of the first resistor 24. The other input terminal of the adder 35 is connected to the positive electrode of the third reference power supply 36. The adder 35 has an output terminal that is connected to the first operational amplifier IC 32. The adder 35 outputs a potential Ve+Vref3 that is obtained by adding the third reference potential Vref3 to the potential Ve of the terminal 24b to the output terminal.

The fourth reference power supply 37 has a positive electrode that is connected to the first operational amplifier IC 32. The fourth reference power supply 37 has a negative electrode that is connected to the ground. The fourth reference power supply 37 outputs a fourth reference potential Vref4. The fourth reference potential Vref4 is higher than the third reference potential Vref3.

The first operational amplifier IC 32 has a first operational amplifier 32a and a first selector 32b. Into the first selector 32b, the potential Ve+Vref3 that is output from the adder 35 and the fourth reference potential Vref4 that is output from the fourth reference power supply 37 are input. The first selector 32b outputs a lower one of the potential Ve+Vref3 and the potential Vref4.

The first operational amplifier 32a has an inverting input, into which the output potential from the first selector 32b (i.e., the lower one of the potential Ve+Vref3 and the potential Vref4) is input. The first operational amplifier 32a has a non-inverting input, into which the potential Vd is input. The first operational amplifier 32a has an output portion that is connected to a gate 22c of the pMOS 22. The first operational amplifier 32a outputs a plus potential when the non-inverting input has a higher potential than the inverting input, and outputs a minus potential when the inverting input has a higher potential than the non-inverting input. In this way, the first operational amplifier 32a controls the potential of the gate 22c of the pMOS 22 so that the potential that is input into the non-inverting input and the potential that is input into the inverting input can be equal to each other.

The switch 34 is connected between the source 22b and the gate 22c of the pMOS 22. The switch 34 switches the state between the source 22b and the gate 22c between a conducting state and a cutoff state. The switch 34 is controlled by a signal from the controller 70.

Figure 10:
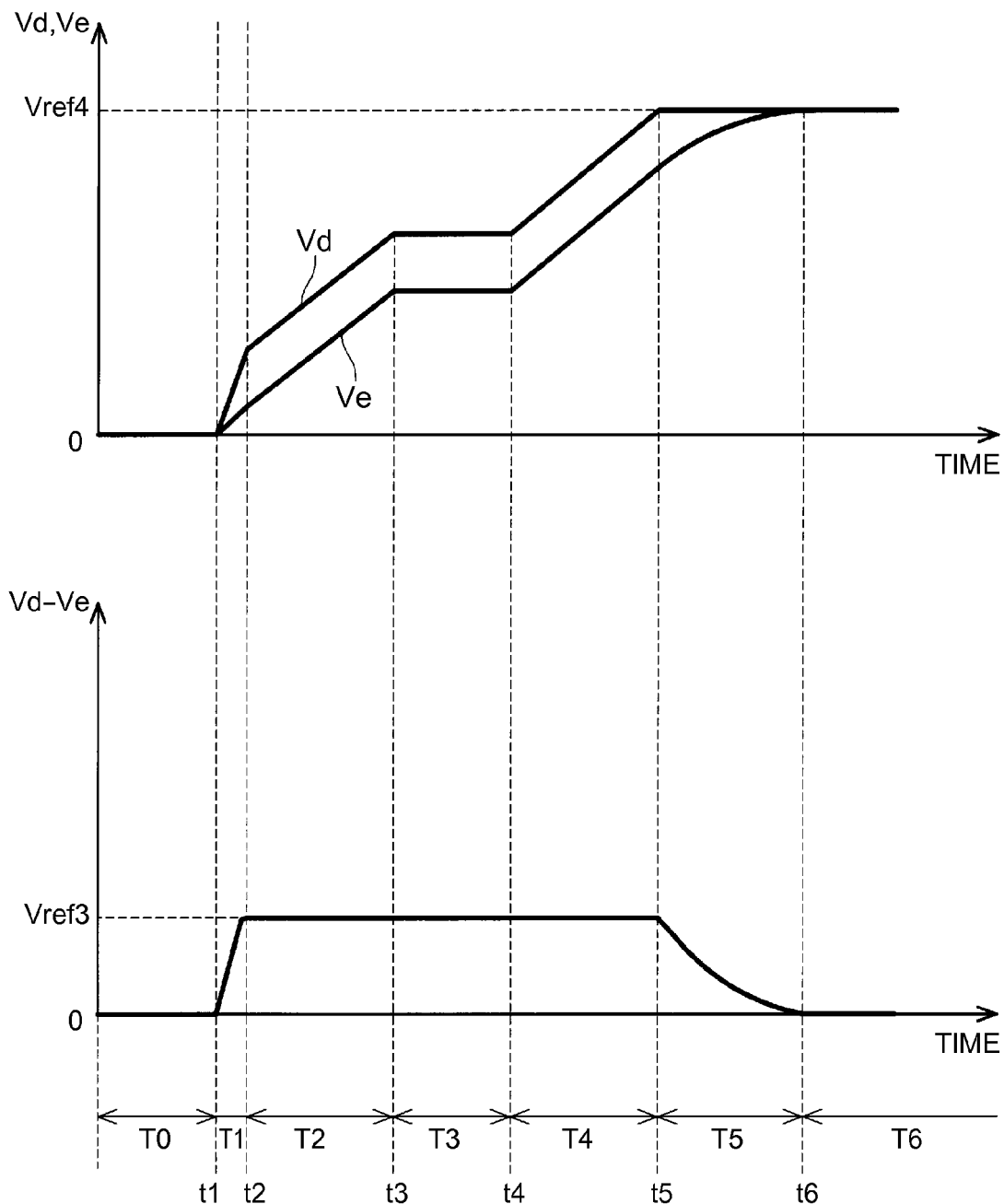
FIG. 10 is a graph that shows how voltages change when an IGBT is turned on in the third embodiment of the present invention.

The operation of the gate potential control circuit 10c is next described. FIG. 10 shows how the potentials Vd and Ve and the potential difference Vd−Ve change when the IGBT 12 is switched from an off state (the state during period T0 in FIG. 10) to an on state (the state during period T6 in FIG. 10). When the IGBT 12 is in an off state (i.e., during period T0), the nMOS 42 is on and the switch 34 is on (i.e., the pMOS 22 is off). Thus, a ground potential (0 V) is being applied to the gate 12a of the IGBT 12. Thus, the potentials Vd and Ve are both 0 V.

The controller 70 turns off the nMOS 42 and turns off the switch 34 at time t1 in FIG. 10. When the switch 34 is turned off, the potential of the gate 22c of the pMOS 22 becomes controllable by the first operational amplifier 32a. At time t1, because the potential Ve is generally 0 V (ground potential), the output potential Ve+Vref3 from the adder 35 is equal to the third reference potential Vref3. Because the third reference potential Vref3 is lower than the fourth reference potential Vref4, the first selector 32b inputs the third reference potential Vref3 into the inverting input of the first operational amplifier 32a. Because the inverting input has a higher potential (Vref3) than the non-inverting input (Vd=0 V), the first operational amplifier 32a decreases the potential of the output portion (i.e., the gate 22c of the pMOS 22). As a result, the pMOS 22 is turned on, and a gate current flows from the insulation power supply 60 via the pMOS 22 and the first resistor 24 toward the gate 12a of the IGBT 12. When the pMOS 22 is turned on at time t1, the gate current increases and the potential difference Vd−Ve increases accordingly during the subsequent period T1. In addition, because electric charge is accumulated in the gate 12a as the gate current flows, the potential of the gate 12a gradually increases. Thus, during period T1, the potentials Vd and Ve increase. In addition, during period T1, because the potential Vd that is input into the non-inverting input is low, the first operational amplifier 32a decreases the output potential (i.e., the potential of the gate 22c) in accordance with its slew rate. Thus, during period T1, the potentials Vd and Ve increase at a gradient that is determined by the slew rate of the first operational amplifier 32a. Even after time t1, because the potential Ve+Vref3 is still lower than the fourth reference potential Vref4, the potential Ve+Vref3 continued to be input into the inverting input of the first operational amplifier 32a.

When the gate current increases during period T1, the potential difference Vd–Ve reaches the third reference potential Vref3 at time t2. In other words, Vd=Ve+Vref3 is fulfilled at time t2. In other words, the inverting input and the non-inverting input of the first operational amplifier 32a have generally the same potential. Then, the first operational amplifier 32a controls the potential of the gate 22c so that the relationship Vd=Ve+Vref3 can be maintained. Thus, during period T2 after time t2, the potential difference Vd–Ve is generally constant at the third reference potential Vref3. In other words, the gate current is generally constant. Thus, during period T2 after time t2, the potentials Vd and Ve increase at a gradient that is determined by the constant gate current. The potentials Vd and Ve maintain a generally constant value during period T3 after time t3. This is because electric charge is charged into the Miller capacity of the IGBT 12. During period T3, the gate current (i.e., the potential difference Vd–Ve) is still generally constant. After that, the charge of electric charge into the Miller capacity is completed at time t4. Thus, during period T4 after time t4, the potentials Vd and Ve increase again. Because the gate current is still generally constant during period T4, the potentials Vd and Ve increase during period T4 at generally the same gradient as that during the period T2. When the potential Vd reaches the fourth reference potential Vref4 at time t5, the potential Ve+Vref3 has become higher than the fourth reference potential Vref4. Thus, the first selector 32b inputs the fourth reference potential Vref4 into the inverting input of the first operational amplifier 32a. Then, the first operational amplifier 32a controls the potential of the gate 22c so that the potential Vd can be maintained at the fourth reference potential Vref4. As a result, the gate current decreases, and the potential difference Vd–Ve decreases accordingly. However, because the gate current continues to flow even after that, the potential Ve continues to increase during period T5. Thus, during period T5, the fourth reference potential Vref4 continues to be input into the inverting input of the first operational amplifier 32a. Thus, during period T5, the pMOS 22 is controlled so that the potential Vd can be equal to the fourth reference potential Vref4. Thus, the gate current gradually decreases during period T5, and the gate current (i.e., the potential difference Vd–Ve) becomes generally zero at time t6 when the potential Ve increases to a potential equal to the fourth reference potential Vref4. After that, the first operational amplifier 32a maintains a state where the potentials Vd and Ve are equal to the fourth reference potential Vref4. Thus, the IGBT 12 is turned on. After that, to turn off the IGBT 12, the nMOS 42 is turned on and the pMOS 22 is turned off as in the case of the first embodiment.

As described above, in this gate potential control circuit 10c, the pMOS 22 is controlled so that the potential difference Vd–Ve between both ends of the first resistor 24 cannot exceed a predetermined potential Vref3 when the IGBT 12 is turned on. Thus, during periods T2 to T4, the potential difference Vd–Ve (i.e., the gate current) is constant and the gradient at which the potentials Vd and Ve increase is controlled to a gradient that is determined by the gate current. In other words, during periods T2 and T4, the gradient at which the potentials Vd and Ve increase is controlled to a generally constant gradient that is smaller than a gradient that is determined by the slew rate. Thus, with this gate potential control circuit 10c, variation in switching speed is reduced. In addition, the potentials Vd and Ve can be accurately controlled by the first operational amplifier 32a.

Figure 11:
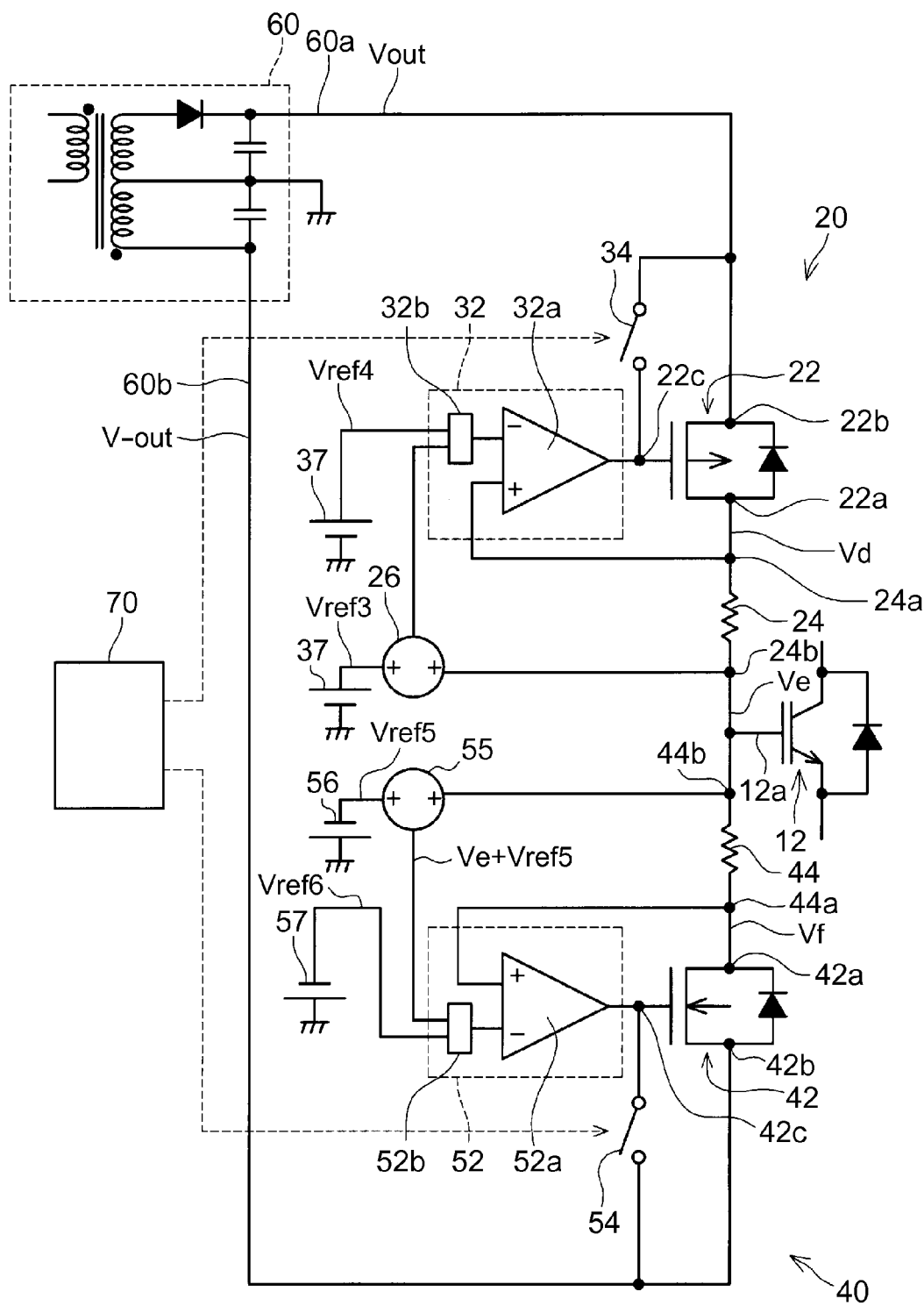
FIG. 11 is a circuit diagram of a gate potential control circuit 10d of a fourth embodiment of the present invention.

A gate potential control circuit 10d of a fourth embodiment that is shown in FIG. 11 is different from the gate potential control circuit 10c of the third embodiment in configuration of the insulation power supply 60 and the gate discharge circuit 40.

The insulation power supply 60 of the fourth embodiment has an output terminal 60b. To the output terminal 60b, a minus potential V-out (a potential that is lower than that of the ground) is output. The potential V-out is the lowest potential in the gate potential control circuit 10d.

The gate discharge circuit 40 of the fourth embodiment has an nMOS 42, a second resistor 44, an adder 55, a fifth reference power supply 56, a sixth reference power supply 57, a second operational amplifier IC 52, and a switch 54.

The nMOS 42 and the second resistor 44 are connected in series between the gate 12a of the IGBT 12 and the minus side output terminal 60b of the insulation power supply 60 as in the case of the second embodiment. A potential Vf that is shown in FIG. 11 is the potential of the terminal 44a of the second resistor 44, which is equal to the potential of the drain 42a of the nMOS 42. The potential Ve is equal to the potential of the terminal 44b of the second resistor 44.

The fifth reference power supply 56 has a negative electrode that is connected to the adder 55. The fifth reference power supply 56 has a positive electrode is connected to the ground. The fifth reference power supply 56 outputs a fifth reference potential Vref5. The fifth reference potential Vref5 is a minus potential that is lower than that of the ground.

One of input terminals of the adder 55 is connected to the terminal 44b of the second resistor 44. The other input terminal of the adder 55 is connected to the negative electrode of the fifth reference power supply 56. The adder 55 has an output terminal that is connected to the second operational amplifier IC 52. The adder 55 outputs a potential Ve+Vref5 that is obtained by adding the fifth reference potential Vref5 to the potential Ve of the terminal 44b to the output terminal.

The sixth reference power supply 57 has a negative electrode that is connected to the second operational amplifier IC 52. The sixth reference power supply 57 has a positive electrode that is connected to the ground. The sixth reference power supply 57 outputs a sixth reference potential Vref6. The sixth reference potential Vref6 is a minus potential that is lower than that of the ground. The sixth reference potential Vref6 is lower than the fifth reference potential Vref5 (i.e., the absolute value of the sixth reference potential Vref6 is greater than the absolute value of the fifth reference potential Vref5).

The second operational amplifier IC 52 has a second operational amplifier 52a and a second selector 52b. Into the second selector 52b, the potential Ve+Vref5 that is output from the adder 55 and the sixth reference potential Vref6 that is output from the sixth reference power supply 57 are input.

The second selector 52*b* outputs a higher one of the potential Ve+Vref5 and the potential Vref6.

The second operational amplifier 52*a* has an inverting input, into which the output potential from the second selector 52*b* (i.e., the higher one of the potential Ve+Vref5 and the potential Vref6) is input. The second operational amplifier 52*a* has a non-inverting input, into which the potential Vf is input. The second operational amplifier 52*a* has an output portion that is connected to the gate 42*c* of the nMOS 42. The second operational amplifier 52*a* outputs a plus potential when the non-inverting input has a higher potential than the inverting input, and outputs a minus potential when the inverting input has a higher potential than the non-inverting input. In this way, the second operational amplifier 52*a* controls the potential of the gate 42*c* of the nMOS 42 so that the potential that is input into the non-inverting input and the potential that is input into the inverting input can be equal to each other.

The switch 54 is connected between the source 42*b* and the gate 42*c* of the nMOS 42. The switch 54 switches the state between the source 42*b* and the gate 42*c* between a conducting state and a cutoff state. The switch 54 is controlled by a signal from the controller 70.

Figure 12:
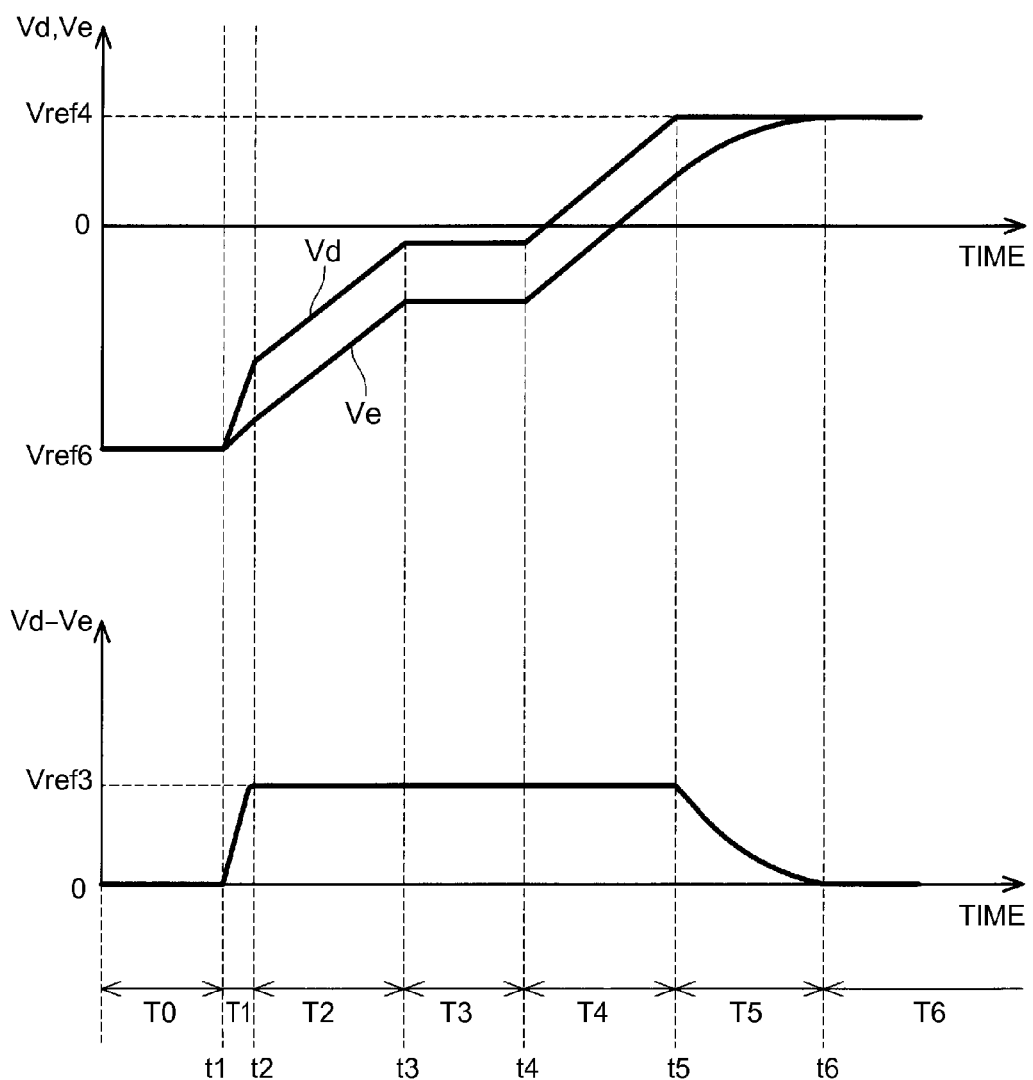
FIG. 12 is a graph that shows how voltages change when an IGBT is turned on in the fourth embodiment of the present invention.

The operation of the gate potential control circuit 10*d* is next described. FIG. 12 shows how the potentials Vd and Ve and the potential difference Vd–Ve change when the IGBT 12 is switched from an off state (the state during period T0 in FIG. 12) to an on state (the state during period T6 in FIG. 12). As shown in FIG. 12, during period T0 when the IGBT 12 is off, the potentials Vd and Ve are equal to the sixth reference potential Vref6 (minus potential). In other words, the sixth reference potential Vref6 is being applied to the gate 12*a* of the IGBT 12. To turn on the IGBT 12, the controller 70 turns on the switch 54 and turns off the switch 34. When the switch 54 is turned on, the nMOS 42 is turned off. When the switch 34 is turned off, the gate charge circuit 20 increases the potentials Vd and Ve to the fourth reference potential Vref4. This operation is the same as the operation in the first embodiment except that the potential Vref6 that is output when the IGBT 12 is off is a minus potential.

Figure 13:
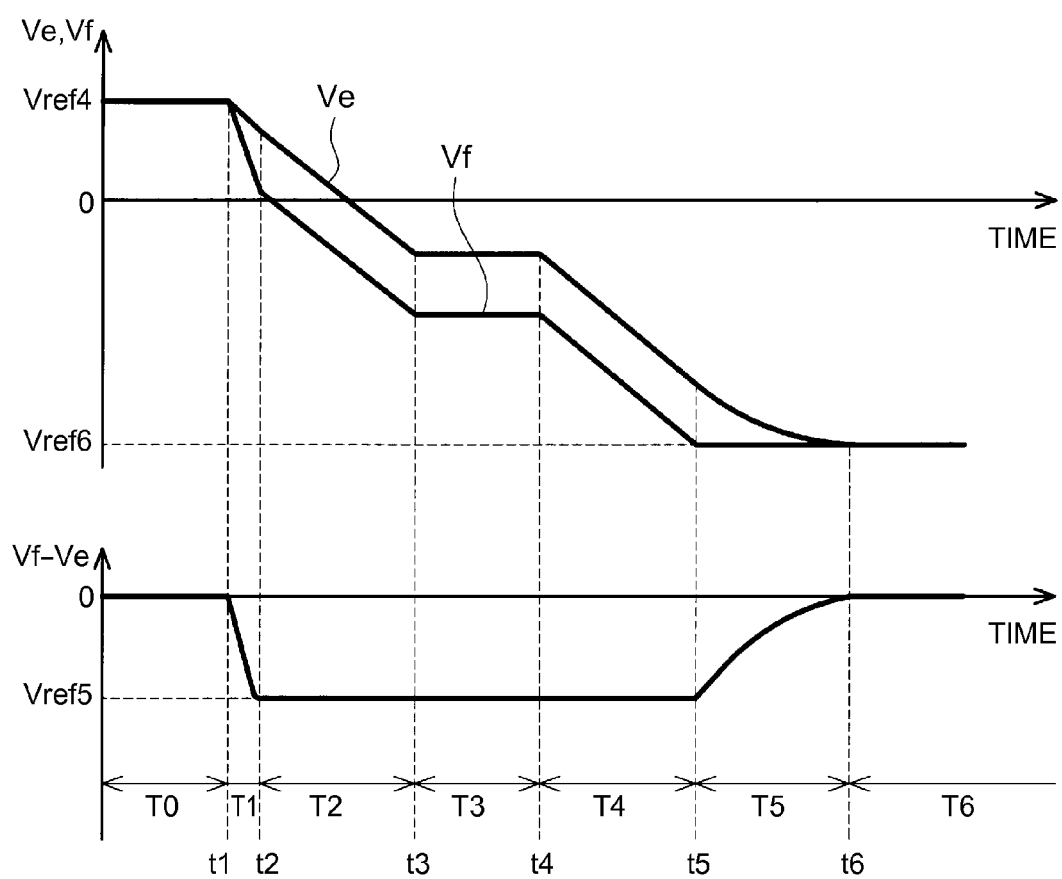
FIG. 13 is a graph that shows how voltages change when an IGBT is turned off in the fourth embodiment of the present invention.

The operation that is performed in the gate potential control circuit 10*d* when the IGBT 12 is turned off is next described. FIG. 13 shows how the potentials Ve and Vf and the potential difference Vf–Ve change when the IGBT 12 is switched from an on state (the state during period T0 in FIG. 13) to an off state (the state during period T6 in FIG. 13). As described above, during the period when the IGBT 12 is on (period T0 in FIG. 13), the switch 54 is on and the switch 34 is off. The controller 70 turns off the switch 54 and turns on the switch 34 at time t1 in FIG. 13. When the switch 34 is turned on, the pMOS 22 is turned off. When the switch 54 is turned off, the potential of the gate 42*c* of the nMOS 42 becomes controllable by the second operational amplifier 52*a*. At time t1, because the potential Ve is equal to the fourth reference potential Vref4, the output potential Ve+Vref5 from the adder 55 is equal to the potential Vref4+Vref5. At this stage, the potential Vref4+Vref5 is higher than the sixth reference potential Vref6. Thus, the second selector 52*b* inputs the potential Vref4+Vref5 into the inverting input of the second operational amplifier 52*a*. Because the non-inverting input has a higher potential (Vf=Vref4) than the inverting input (Vref4+Vref5), the second operational amplifier 52*a* increases the potential of the output portion (i.e., the gate 42*c* of the nMOS 42). As a result, the nMOS 42 is turned on, and a gate current flows from the gate 12*a* of the IGBT 12 via the second resistor 44 and the nMOS 42 toward the output terminal 60*b* of the insulation power supply 60.

When the nMOS 42 is turned on at time t1, the gate current increases and the potential difference Vf–Ve decreases (the absolute value of the potential difference Vf–Ve increases) accordingly during the subsequent period T1. In addition, because electric charge is discharged from the gate 12*a* as the gate current flows, the potential of the gate 12*a* gradually decreases. Thus, during period T1, the potentials Ve and Vf decrease. During period T1, because the potential Vf that is input into the non-inverting input is high, the second operational amplifier 52*a* increases the output potential (i.e., the potential of the gate 42*c*) in accordance with its slew rate. Thus, during period T1, the potentials Ve and Vf decrease at a gradient that is determined by the slew rate of the second operational amplifier 52*a*. Even after time t1, because the potential Ve+Vref5 is still higher than the sixth reference potential Vref6, the potential Ve+Vref5 continues to be input into the inverting input of the second operational amplifier 52*a*.

When the gate current increases during period T1, the potential difference Vf–Ve reaches the fifth reference potential Vref5 at time t2. In other words, Vf =Ve+Vref5 is fulfilled at time t2. In other words, the inverting input and the non-inverting input of the first operational amplifier 32*a* have generally the same potential. Then, the second operational amplifier 52*a* controls the potential of the gate 42*c* so that the relationship Vf =Ve+Vref5 can be maintained. Thus, during period T2 after time t2, the potential difference Vf–Ve is generally constant at the fifth reference potential Vref5. In other words, the gate current is generally constant. Thus, during period T2 after time t2, the potentials Ve and Vf decrease at a gradient that is determined by the constant gate current. The potentials Ve and Vf maintain a generally constant potential during period T3 after time t3. This is because electric charge is discharged from the Miller capacity of the IGBT 12. During period T3, the gate current (i.e., the potential difference Vf–Ve) is still generally constant. After that, the discharge of electric charge from the Miller capacity is completed at time t4. Thus, during period T4 after time t4, the potentials Ve and Vf decrease again. Because the gate current is still generally constant during period T4, the potentials Ve and Vf decrease during period T4 at generally the same gradient as that during period T2. When the potential Vf reaches the sixth reference potential Vref6 at time t5, the potential Ve+Vref5 has become lower than the sixth reference potential Vref6. Thus, the second selector 52*b* inputs the sixth reference potential Vref6 into the inverting input of the second operational amplifier 52*a*. Then, the second operational amplifier 52*a* controls the potential of the gate 42*c* so that the potential Vf can be maintained at the sixth reference potential Vref6. As a result, the gate current decreases, and the potential difference Vf–Ve decreases accordingly. However, because the gate current continues to flow even after that, the potential Ve continues to decrease even during period T5. Thus, during period T5, the sixth reference potential Vref6 continues to be input into the inverting input of the second operational amplifier 52*a*. Thus, during period T5, the nMOS 42 is controlled so that the potential Vf can be equal to the sixth reference potential Vref6. Thus, the gate current gradually decreases during period T5, and the gate current (i.e., the potential difference Vf–Ve) becomes generally zero at time t6 when the potential Ve decreases to a potential equal to the sixth reference potential Vref6. After that, the second operational amplifier 52*a* maintains a state where the potentials Ve and Vf are equal to the sixth reference potential Vref6. As a result, the IGBT 12 is turned off.

As described above, in this gate potential control circuit 10d, the nMOS 42 is controlled so that the potential difference Vf−Ve between both ends of the second resistor 44 cannot fall below a predetermined potential Vref5 (i.e., the absolute value of the potential difference Vf−Ve cannot exceed the absolute value of the predetermined potential Vref5) when the IGBT 12 is turned off. Thus, during periods T2 to T4, the potential difference Vf−Ve (i.e., the gate current) is constant and the gradient at which the potentials Ve and Vf decrease is controlled to a gradient that is determined by the gate current. In other words, during periods T2 and T4, the gradient at which the potentials Ve and Vf decrease is controlled to a generally constant gradient that is smaller than the gradient that is determined by the slew rate. Thus, with this gate potential control circuit 10d, variation in switching speed is reduced. In addition, the potentials Vd, Ye and Vf can be accurately controlled by the first operational amplifier 32a and the second amplifier 52a.

The relationship between the constituent elements of the third and fourth embodiments and the constituent elements of the present invention is next described. The IGBT 12 of the third and fourth embodiments may be regarded as one example of the driving switching element of the present invention. The output terminal 60a of the insulation power supply 60 of the third and fourth embodiments may be regarded as one example of the first gate potential supply part of the present invention. The first resistor 24 of the third and fourth embodiments may be regarded as one example of the first resistor of the present invention. The pMOS 22 of the third and fourth embodiments may be regarded as one example of the first switching element of the present invention. The first operational amplifier 32a of the third and fourth embodiments may be regarded as one example of the first operational amplifier of the present invention. It should be noted that the lower one of the potential Ve+Vref3 and the potential Vref4 (i.e., a farther value from the output potential Vout that is output from the insulation power supply 60) is input into the inverting input of the first operational amplifier 32a of the third and fourth embodiments. The farther value may be regarded as a value having a larger deviation from the output potential Vout. The third reference potential Vref3 of the third and fourth embodiments may be regarded as one example of the third reference potential of the present invention and also as one example of the seventh reference potential of the present invention. The fourth reference potential Vref4 of the third and fourth embodiments may be regarded as one example of the fourth reference potential of the present invention and also as one example of the eighth reference potential of the present invention. The output terminal 60b of the insulation power supply 60 of the fourth embodiment may be regarded as one example of the second gate potential supply part of the present invention. The nMOS 42 of the fourth embodiment may be regarded as one example of the second switching element of the present invention. The second resistor 44 of the fourth embodiment may be regarded as one example of the second resistor of the present invention. The second operational amplifier 52a of the fourth embodiment may be regarded as one example of the second operational amplifier of the present invention. The fifth reference potential Vref5 of the fourth embodiment may be regarded as one example of the fifth reference potential of the present invention and also as one example of the ninth reference potential of the present invention. The sixth reference potential Vref6 of the fourth embodiment may be regarded as one example of the sixth reference potential of the present invention and also as one example of the tenth reference potential of the present invention. The constituent elements of the fourth embodiment and the constituent elements of the present invention can also be recognized as follows. The IGBT 12 of the fourth embodiment may be regarded as one example of the driving switching element of the present invention. The output terminal 60b of the insulation power supply 60 of the fourth embodiment may be regarded as one example of the first gate potential supply part of the present invention. The second resistor 44 of the fourth embodiment may be regarded as one example of the first resistor of the present invention. The nMOS 42 of the fourth embodiment may be regarded as one example of the first switching element of the present invention. The second operational amplifier 52a of the fourth embodiment may be regarded as one example of the first operational amplifier of the present invention. It should be noted that the higher one of the potential Ve+Vref5 and the potential Vref6 (i.e., the farther value from the output potential V-out that is output from the insulation power supply 60) is input into the non-inverting input of the second operational amplifier 52a of the fourth embodiment. As described above, the first gate potential supply part of the present invention may be a gate-on potential (for example, the output potential Vout from the insulation power supply 60 of the third and fourth embodiments) that is used to turn on a driving switching element (i.e., to increase the gate potential of the IGBT), or may be a gate-off potential (for example, the output potential V-out from the insulation power supply 60 of the fourth embodiment) that is used to turn off a driving switching element (i.e., to decrease the gate potential of the IGBT). In this case, the fifth reference potential Vref5 of the fourth embodiment may be regarded as one example of the third reference potential of the present invention and also as one example of the seventh reference potential of the present invention. Also, in this case, the sixth reference potential Vref6 of the fourth embodiment may be regarded as one example of the fourth reference potential of the present invention and also as one example of the eighth reference potential of the present invention.

It should be noted that the third resistors 101 and 102 or the third resistor 103 may be added to the circuits of the third and fourth embodiments as in the case of the circuits that are shown in FIGS. 6 and 7.

While the fact that various potentials are input into the operational amplifier(s) is described in the first to fourth embodiments, potentials obtained by further processing the above-mentioned various potentials may be input into the operational amplifier(s). For example, potentials obtained by multiplying the above-mentioned various potential by a constant may be input into the operational amplifier(s).

While specific examples of the present invention have been described in detail above, these examples are for illustrative purposes only and are not intended to limit the present invention. The present invention includes various variations and modifications of the specific examples that are shown above.

What is claimed is:
1. A gate potential control circuit, comprising:
a driving switching element;
a first gate potential supply part;
a first switching element and a first resistor that are connected in series between a gate of the driving switching element and the first gate potential supply part; and
a first operational amplifier that includes
an output portion connected to a gate of the first switching element, an inverting input into which a first reference potential is input, and a non-inverting input into which a closer one of a first value and a second value to a potential of the first gate potential supply part is input, the first value being based on a potential difference obtained by subtracting a potential of a terminal of the first resistor on a driving switching element side from a potential of a terminal of the first resistor on a first gate potential supply part side, the second value being based on a potential of a terminal of the first switching element.

2. The gate potential control circuit according to claim 1, further comprising:

a second gate potential supply part configured to supply a gate-off potential lower than a gate-on potential supplied by the first gate potential supply part;

a second switching element and a second resistor that are connected in series between the gate of the driving switching element and the second gate potential supply part; and a second operational amplifier that includes an output portion connected to a gate of the second switching element, an inverting input into which a second reference potential is input, and a non-inverting input into which a lower one of a third value and a fourth value is input, the third value being based on a potential difference obtained by subtracting a potential of a terminal of the second resistor on the driving switching element side from a potential of a terminal of the second resistor on a second gate potential supply part side, the fourth value being based on a potential of a terminal of the second switching element on the driving switching element side.

3. The gate potential control circuit according to claim 1, further comprising a third resistor connected between the gate of the driving switching element and the first switching element.

* * * * *